United States Patent
Huang et al.

(10) Patent No.: US 10,852,611 B2
(45) Date of Patent: Dec. 1, 2020

(54) TFT AND LIQUID CRYSTAL DISPLAY

(71) Applicants: Nanjing CEC Panda FPD Technology Co., Ltd., Nanjing (CN); NANJING HUADONG ELECTRONICS INFORMATION & TECHNOLOGY CO., LTD., Nanjing (CN)

(72) Inventors: Hongtao Huang, Nanjing (CN); Chao Dai, Nanjing (CN)

(73) Assignee: NANJING CECPANDA LCD TECHNOLOGY CO., LTD., Nanjing (CN)

(*) Notice: Subject to any disclaimer, the term of this patent is extended or adjusted under 35 U.S.C. 154(b) by 62 days.

(21) Appl. No.: 16/306,552

(22) PCT Filed: Sep. 5, 2017

(86) PCT No.: PCT/CN2017/100528
§ 371 (c)(1),
(2) Date: Nov. 30, 2018

(87) PCT Pub. No.: WO2018/054214
PCT Pub. Date: Mar. 29, 2018

(65) Prior Publication Data
US 2019/0317347 A1    Oct. 17, 2019

(30) Foreign Application Priority Data
Sep. 22, 2016  (CN) .......................... 2016 1 0842536

(51) Int. Cl.
*G02F 1/1368* (2006.01)
*H01L 29/417* (2006.01)
(Continued)

(52) U.S. Cl.
CPC ........ *G02F 1/1368* (2013.01); *H01L 27/1225* (2013.01); *H01L 27/1255* (2013.01);
(Continued)

(58) Field of Classification Search
CPC ......... G09G 3/3677; G09G 2310/0281; G09G 2310/0286; G09G 2310/0267;
(Continued)

(56) References Cited

U.S. PATENT DOCUMENTS

2001/0050368 A1* 12/2001 Moon ................... G02F 1/1368
257/72
2009/0242946 A1   10/2009 Yamamura
(Continued)

FOREIGN PATENT DOCUMENTS

CN    103943684 A    7/2014
CN    104155796      11/2014
(Continued)

*Primary Examiner* — Michael H Caley
*Assistant Examiner* — Jonathan Y Jung
(74) *Attorney, Agent, or Firm* — Cheng-Ju Chiang

(57) ABSTRACT

A TFT (Thin Film Transistor) and a liquid crystal display, the TFT comprises a gate electrode, a gate insulating layer, a semiconductor layer and a source-drain electrode layer. The gate insulating layer is disposed between the gate electrode and the semiconductor layer. The source-drain electrode layer contacts with the semiconductor. The gate electrode and the semiconductor layer are hollowed. The liquid crystal display comprises an array, a color substrate and a liquid crystal layer disposed between the array substrate and the color substrate. The array substrate comprises the TFT described above.

15 Claims, 21 Drawing Sheets

(51) Int. Cl.
*H01L 29/786* (2006.01)
*H01L 27/12* (2006.01)
*H01L 29/423* (2006.01)
*G02F 1/1345* (2006.01)
*G09G 3/36* (2006.01)

(52) U.S. Cl.
CPC .. *H01L 29/41733* (2013.01); *H01L 29/42384* (2013.01); *H01L 29/7869* (2013.01); *H01L 29/78696* (2013.01); *G02F 1/13454* (2013.01); *G09G 3/3677* (2013.01); *G09G 2310/0267* (2013.01); *G09G 2310/0281* (2013.01); *G09G 2310/0283* (2013.01); *G09G 2310/0286* (2013.01)

(58) Field of Classification Search
CPC ........ G09G 2310/0283; H01L 27/1222; H01L 29/78696; H01L 29/42384; H01L 29/0684; G02F 1/13454
See application file for complete search history.

(56) References Cited

U.S. PATENT DOCUMENTS

| | | | | |
|---|---|---|---|---|
| 2012/0299887 | A1* | 11/2012 | Tanaka | G09G 3/3688 345/204 |
| 2013/0335684 | A1* | 12/2013 | Yoshikawa | G02F 1/1333 349/96 |
| 2014/0264324 | A1* | 9/2014 | Yamazaki | H01L 29/78696 257/43 |
| 2015/0070616 | A1* | 3/2015 | Ogasawara | G02F 1/1368 349/43 |
| 2016/0359055 | A1* | 12/2016 | Shang | H01L 29/66742 |
| 2017/0053954 | A1* | 2/2017 | Liu | H01L 27/1274 |

FOREIGN PATENT DOCUMENTS

| | | |
|---|---|---|
| CN | 104409513 | 3/2015 |
| CN | 104658974 A | 5/2015 |
| CN | 105117069 A | 12/2015 |
| CN | 205229635 U | 5/2016 |
| CN | 106252418 A | 12/2016 |

* cited by examiner

TFT AND LIQUID CRYSTAL DISPLAY

CROSS REFERENCE TO RELATED APPLICATION

This application is a 35 U.S.C. § 371 National Phase conversion of International (PCT) Patent Application No. PCT/CN2017/100528, filed on Sep. 5, 2017, which claims priority of Chinese Patent Application No. 201610842536.7, filed by Nanjing Huadong Electronics Information & Technology Co., Ltd. on Sep. 22, 2016, and entitled as "a Thin Film Transistor". The entire disclosure of the above-identified application is incorporated herein by reference. The PCT International Patent Application was filed and published in Chinese.

FIELD OF THE INVENTION

The present invention relates to liquid crystal display technology, and more particularly to a TFT (Thin Film Transistor) and a liquid crystal display.

BACKGROUND OF THE INVENTION

Currently, small and medium size display panels are more and more expected to have narrow border. In order to reduce the border size, panels employ GDM (Gate Driver Monolithic) circuit, instead of IC (integrated circuit) chip, to be used as drive circuit of gate line. The GDM circuit is a gate electrode driving circuit consisting of a TFT (Thin Film Transistor) and a capacitor, and formed on border of an AA (Active Area) of an array substrate. The GDM occupies a smaller space of a border than the IC, therefore reduce the width of the border.

However, the GDM circuit includes several TFTs and capacitors having large area, resulting that transmission of ultraviolet light for solidifying a glue frame is decreased. Therefore, coating area of the glue frame must not be overlapped with the TFT, which limiting further decreasing the border width of the panel. Panel factories design hollowed capacitors used in GDM circuits, in order to increase the transmission of ultraviolet light. However, the hollowed area of the capacitors makes the GDM circuit occupying a larger space at the border area, therefore, the transmission of a large size TFT cannot be improved.

SUMMARY OF THE INVENTION

In order to solve the problems in prior art, the present invention provides a TFT. The TFT can overlap with the glue frame because the TFT has hollowed area which increasing transmission of the ultraviolet light for solidifying the glue frame, thus decreasing the border width.

A TFT comprises a gate electrode, a gate insulating layer, a semiconductor layer and a source-drain electrode layer. The gate insulating layer is disposed between the gate electrode and the semiconductor layer, the source-drain electrode layer contacts with the semiconductor layer, and the gate electrode and the semiconductor layer are designed as hollowed structure.

The present invention further provides a liquid crystal display, comprising an array substrate, a color filter substrate and a liquid crystal layer placed between the array substrate and the color filter substrate. The array substrate comprises a TFT (Thin Film Transistor), and the TFT is the TFT described above.

Compared with the prior art, the TFT of the present invention has following advantages. The gate electrode and the semiconductor of the TFT are designed as hollowed structure, thus a plurality of distributed hoopholes are formed in the TFT. Therefore, the transmission of ultraviolet light for solidifying glue frame is improved, so that improving the solidifying rate of the glue frame coating on the TFT. Hollowed TFT makes the coating domain of the glue frame can completely overlap with the TFT, so as to decrease the border width.

BRIEF DESCRIPTION OF THE DRAWINGS

FIG. 1b is a cross-sectional view along A-A of FIG. 1a.
FIG. 1c is a cross-sectional view along B-B of FIG. 1a.
FIG. 1d is a cross-sectional view along C-C of FIG. 1a.
FIG. 1e is a schematic view showing a gate electrode of the hollowed TFT of FIG. 1a.
FIG. 1f is a schematic view showing a semiconductor layer of the hollowed TFT of FIG. 1a.
FIG. 1g is a schematic view showing a source-drain electrode layer of the hollowed TFT of FIG. 1a.
FIG. 2b is a cross-sectional view along A-A of FIG. 2a.
FIG. 2c is a cross-sectional view along B-B of FIG. 2a.
FIG. 2d is a cross-sectional view along C-C of FIG. 2a.
FIG. 3b is a cross-sectional view along A-A of FIG. 3a.
FIG. 3c is a cross-sectional view along B-B of FIG. 3a.
FIG. 3d is a cross-sectional view along C-C of FIG. 3a.
FIG. 3e is a schematic view showing a gate electrode of the hollowed TFT of FIG. 3a.
FIG. 3f is a schematic view showing a semiconductor layer of the hollowed TFT of FIG. 3a.
FIG. 3g is a schematic view showing a source-drain electrode layer of the hollowed TFT of FIG. 3a.
FIG. 4b is a cross-sectional view along A-A of FIG. 4a.
FIG. 4c is a cross-sectional view along B-B of FIG. 4a.
FIG. 4d is a cross-sectional view along C-C of FIG. 4a.
FIG. 4h is a cross-sectional view along A-A of FIG. 4a.

FIG. 5b is a cross-sectional view along A-A of FIG. 5a.
FIG. 5c is a cross-sectional view along B-B of FIG. 5a.
FIG. 5d is a cross-sectional view along C-C of FIG. 5a.

DETAILED DESCRIPTION OF PREFERRED EMBODIMENTS

Figure 1A:
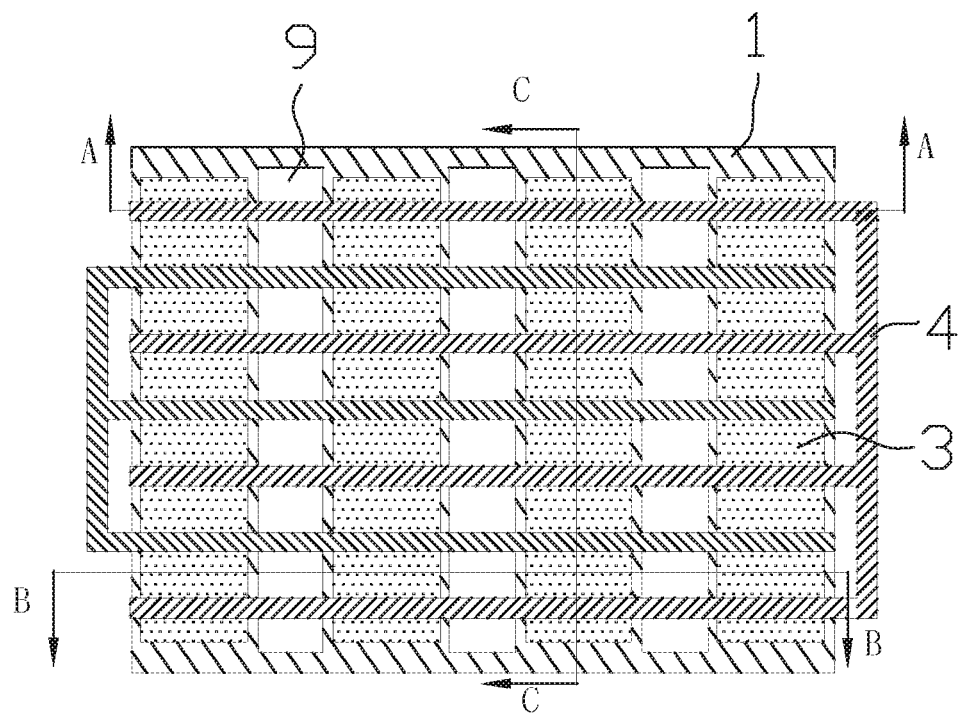
FIG. 1a is a schematic view showing a BCE hollowed TFT according to an embodiment of the present invention.
Figure 1B:
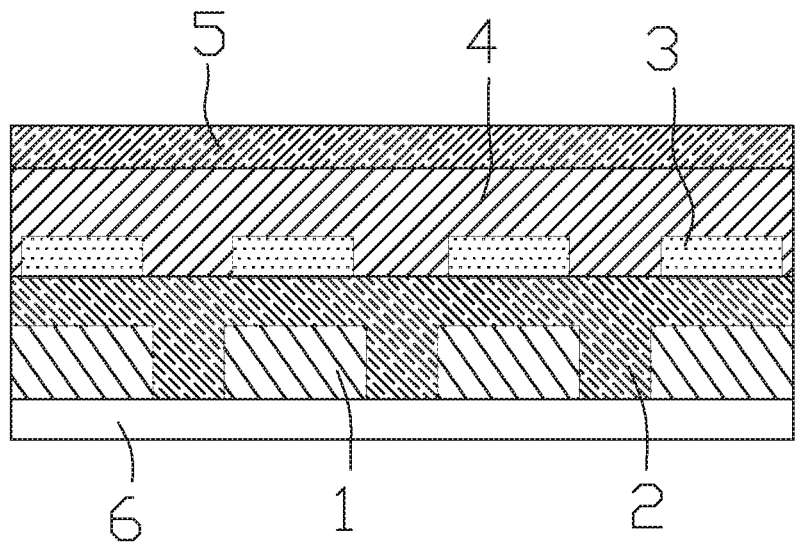
Figure 1C:
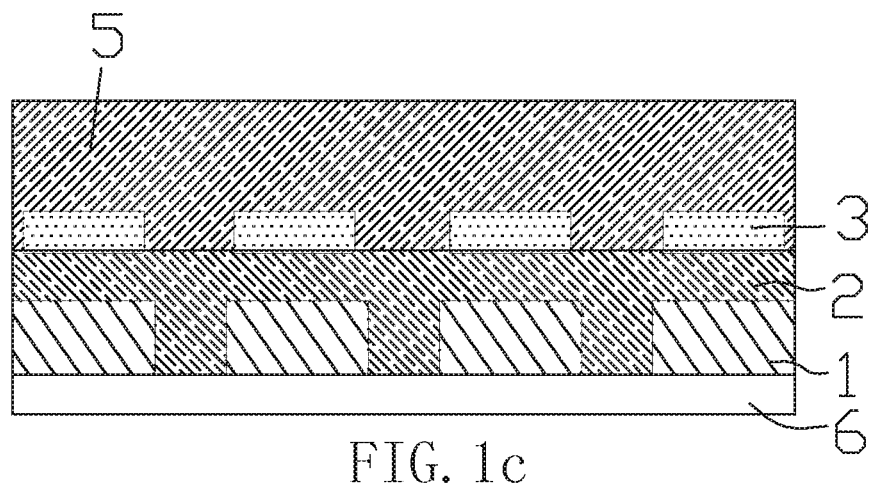
Figure 1D:
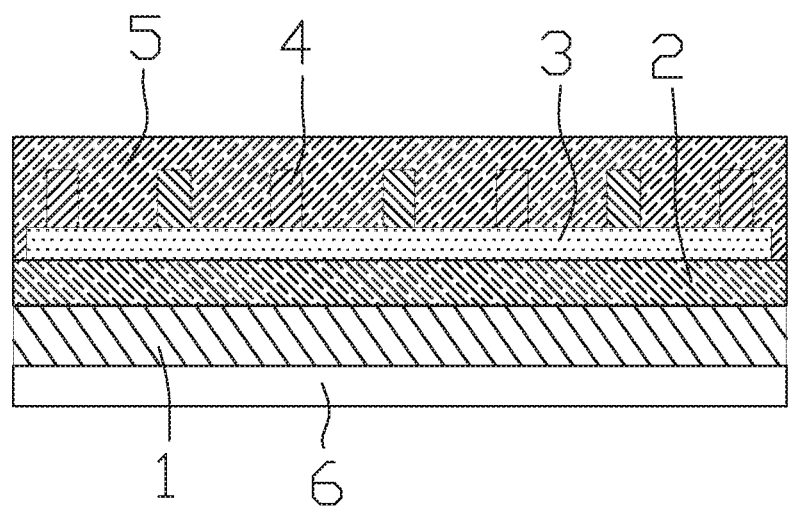

In order to make the purposes, characteristics, and advantages of the present application more apparently, embodiments of the present application will now be described in more detail with reference to the drawing figures.

In order to show the drawings clearly, sizes and relative size of the layers and domains are overstated. It should be understood that, when an element such as a layer, a domain or a substrate described as "formed on", "disposed on" or "located on" another element, the element can be directly disposed on the other element, and also can be disposed on an intermediated element. On the contrary, when an element described as "directly formed on" or "directly disposed on" another element, there is no intermediated element.

The First Embodiment

Referring to FIG. 1a to FIG. 1g, a TFT (Thin Film Transistor) of an embodiment of the present invention is a BCE (Back channel etching), hollowed TFT, with no capacitor. The hollowed TFT includes a gate electrode 1, a gate insulating layer 2, a semiconductor layer 3, a source-drain electrode layer 4 and a passivation layer 5. The gate electrode 1 is directly formed on a base 6, and the gate electrode 1 is formed of metal. The gate insulating layer 2 is disposed on the gate electrode 1, and separates the gate electrode 1 from the semiconductor layer 3. The semiconductor layer 3 is disposed on the gate insulating layer 2. The source-drain electrode layer 4, to form a source electrode 4a and a drain electrode 4b, is disposed on the semiconductor layer 3 and directly contacts with the semiconductor layer 3. The passivation layer 5 is disposed at the outermost layer, and is disposed on the source-drain electrode layer 4, so as to separate the TFT from external environment.

The material of the semiconductor layer 3 includes metal oxide, a-Si: H (Hydrogenated Amorphous Silicon) or poly silicon. The material of the gate electrode 1 and the source-drain electrode layer 4 is selected from a group including Ti (Titanium), Cu (Copper), Al (Aluminum), Mo (Molybdenum), Cr (Chromium), and any combination thereof, or an alloy formed of one or more of Ti, Cu, Al, Mo, Cr. Preferably, the material of the semiconductor layer 3 is metal oxide, the material of the gate electrode 1 is Ti or Cu, and the material of the source-drain electrode layer 4 is Ti or Cu. The base 6 may be glass base.

Figure 1E:
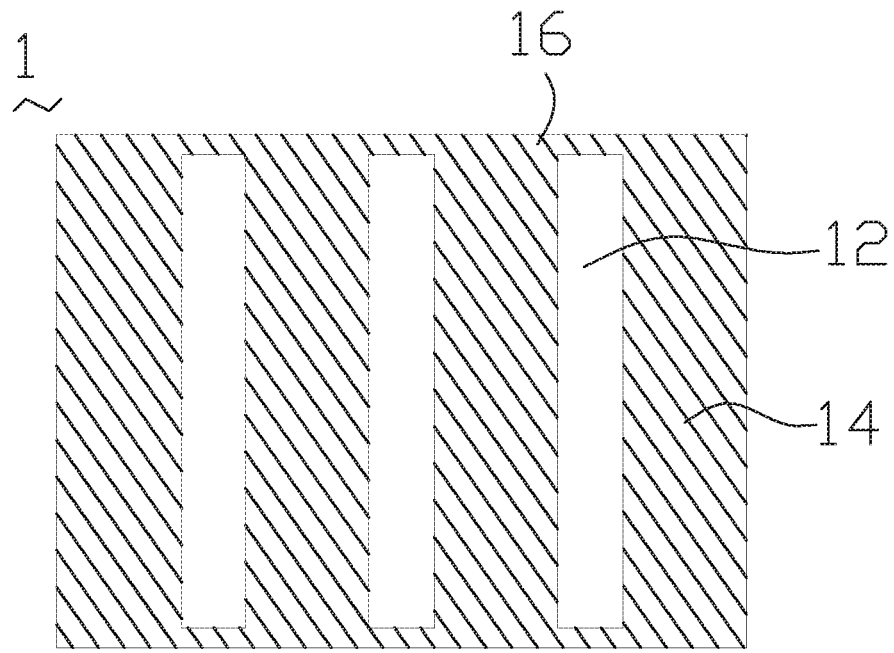

Specifically, referring to FIG. 1e, the gate electrode 1 includes a plurality of strip-shaped gate portions 14 separating from each other and gate connecting portions 16. Two gate connecting portions 16 are disposed respectively at two ends of the strip-shaped gate portions 14. The strip-shaped gate portions 14 are parallel. A gate hollowed domain 12 is formed between every two adjacent strip-shaped gate portions 14, thus forming the hollowed structure gate electrode 1. The gate connecting portions 16 connect the separated strip-shaped gate portions 14 together, thus forming a whole one gate electrode 1.

Figure 1F:
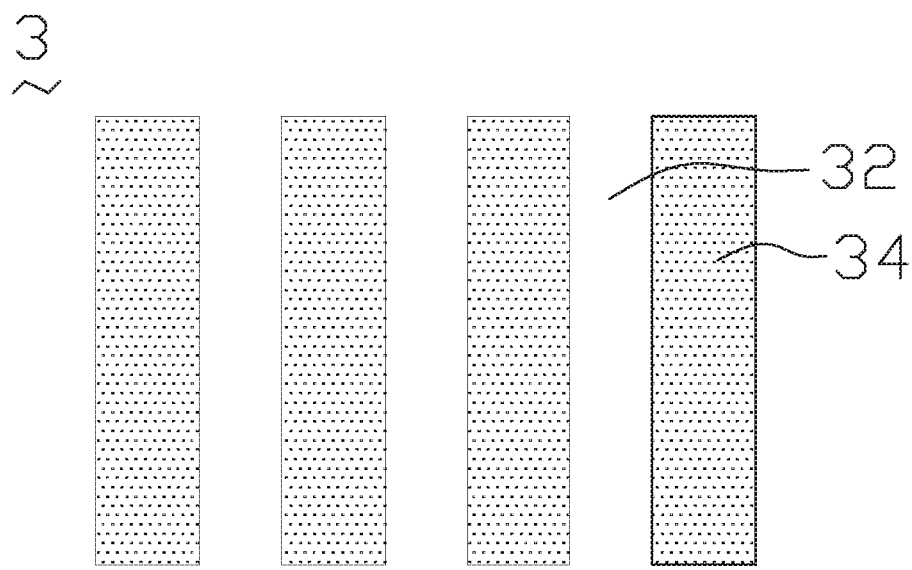

Referring to FIG. 1f, the semiconductor layer 3 includes a plurality of strip-shaped semiconductor portions 34 separating from each other, and the strip-shaped semiconductor portions 34 are parallel. A semiconductor hollowed domain 32 is formed between every two adjacent strip-shaped semiconductor portions 34, thus forming the hollowed structure semiconductor layer 3. Specifically, the semiconductor hollowed domains 32 are located corresponding to the gate hollowed domains 12, and the strip-shaped semiconductor portions 34 are located corresponding to the strip-shaped gate portions 14. The strip-shaped semiconductor portions 34 and the strip-shaped gate portions 14 extend along a first direction and overlap with each other. The first direction can be a vertical direction.

Figure 1G:
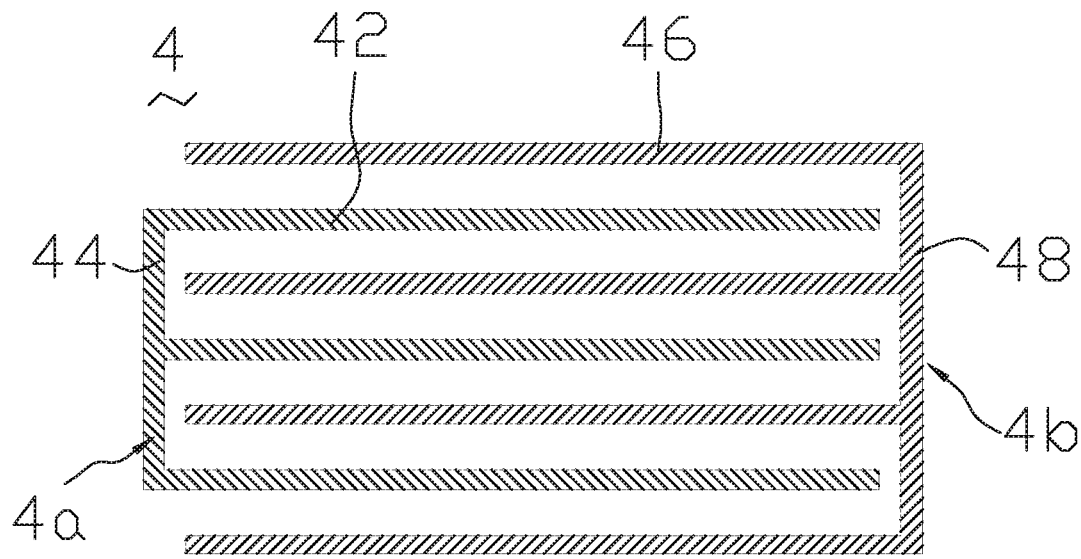

Referring to FIG. 1g, the source electrode 4a and the drain electrode 4b of the source-drain electrode layer 4 are separated. The source electrode 4a includes a plurality of strip-shaped source portions 42 separating from each other and source connecting portions 44 for connecting ends of the strip-shaped source portions 42. The strip-shaped source portions 42 are parallel. The drain electrode 4b includes a plurality of strip-shaped drain portions 46 separating from each other and drain connecting portions 48 for connecting ends of the strip-shaped drain portions 46. The strip-shaped drain portions 46 are parallel. The strip-shaped source portions 42 and strip-shaped drain portions 46 extend along a second direction. The second direction can be the horizontal direction, that is, the above first direction is perpendicular to the second direction, thus, strip-shaped semiconductor portions 34 and the strip-shaped gate portions 14 are perpendicular to the strip-shaped source portions 42 and strip-shaped drain portions 46. The source connecting portions 44 connect the separated strip-shaped source portions 42 together, thus forming a whole one source electrode 4a. The drain connecting portions 48 connect the separated strip-shaped drain portions 46 together, thus forming a whole one drain electrode 4b.

Specifically, the strip-shaped source portions 42 of the source electrode 4a and the strip-shaped drain portions 46 of the drain electrode 4b are inserted into each other, in other words, the strip-shaped source portions 42 and the strip-shaped drain portions 46 are alternately disposed. That is, one strip-shaped drain portion 46 is disposed between two strip-shaped source portions 42, and one strip-shaped source portion 42 is disposed between two strip-shaped drain portions 46.

The gate hollowed domains 12, the semiconductor hollowed domains 32 and the gap between the strip-shaped source portions 42 and the strip-shaped drain portions 46 define a plurality of distributed hoopholes 9. The hoopholes 9 are square, rectangular or circular. It can be understood that, the hoopholes 9 may be other shapes. The hoopholes 9 may be uniformly positioned on the TFT. Solidification of the glue frame will not be affected even if the TFT with large size is overlapped with the glue frame because of the hoopholes 9. Therefore, the border width of the display panel is narrowed.

Figure 1H:
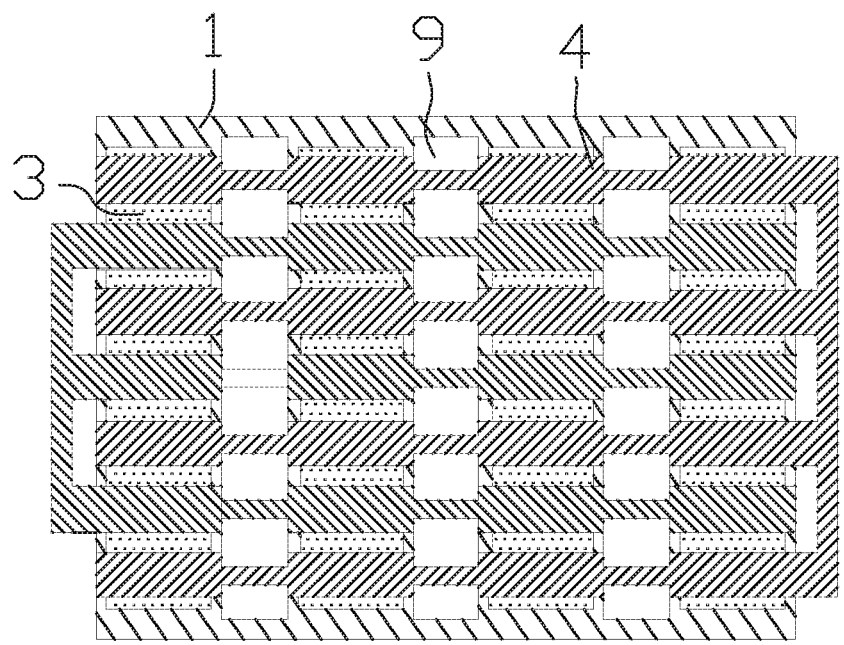
FIG. 1h is a schematic view showing the other BCE hollowed TFT according to an embodiment of the present invention.
Figure 2A:
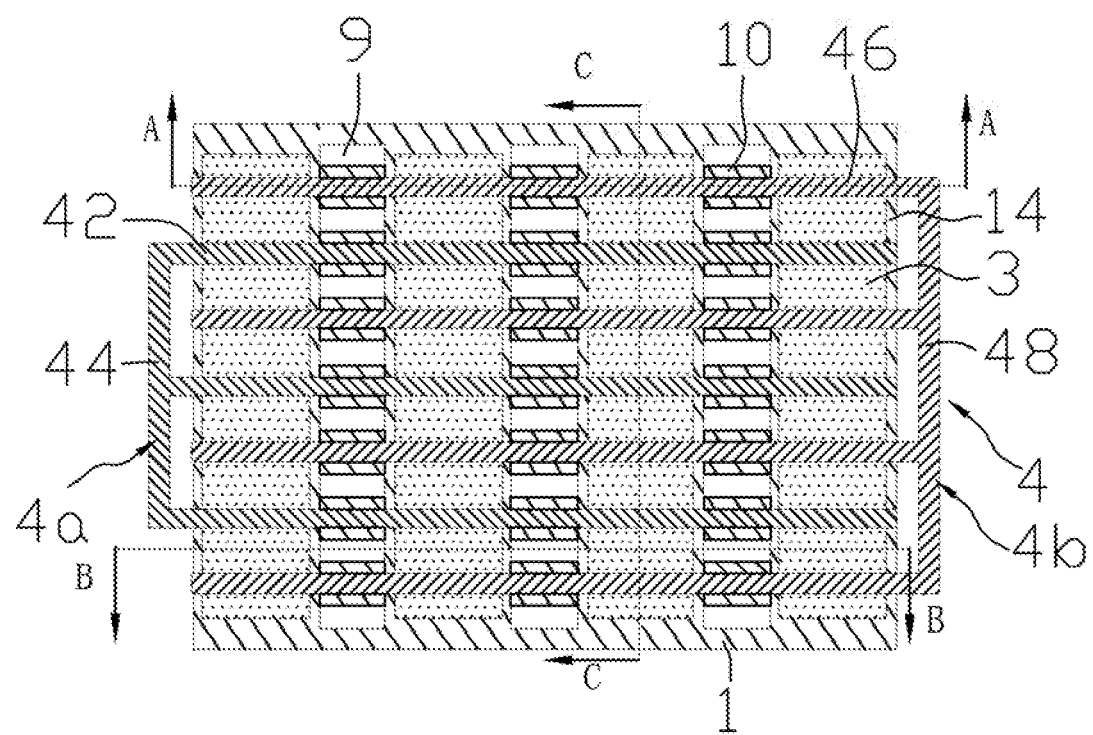
FIG. 2a is a schematic view showing more one BCE hollowed TFT according to an embodiment of the present invention.
Figure 2B:
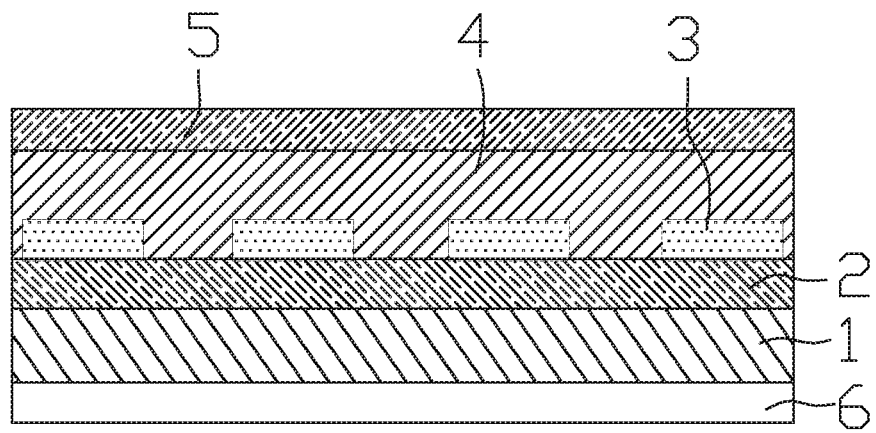
Figure 2C:
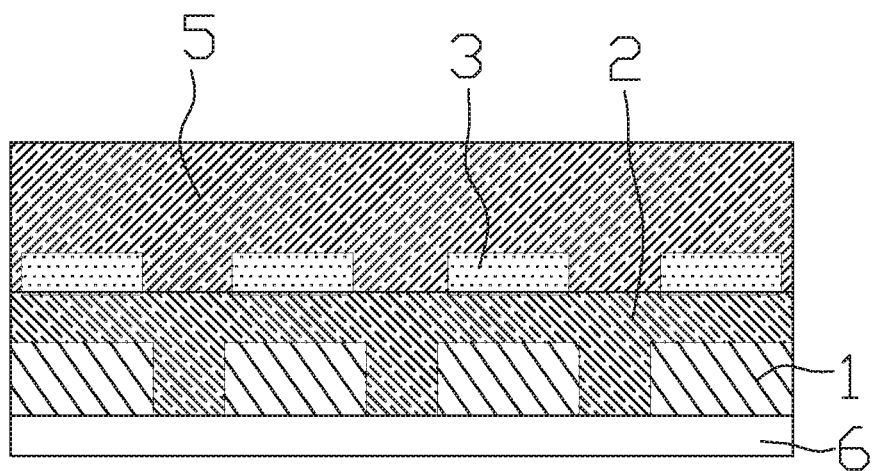
Figure 2D:
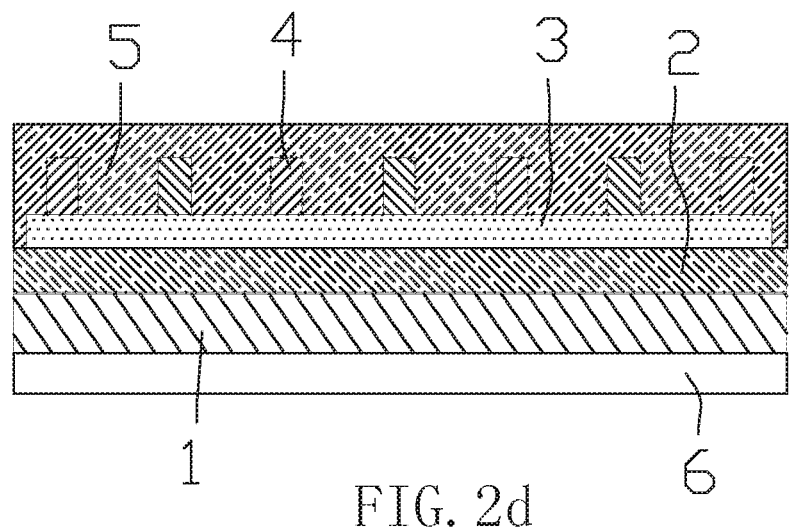
Figure 2E:
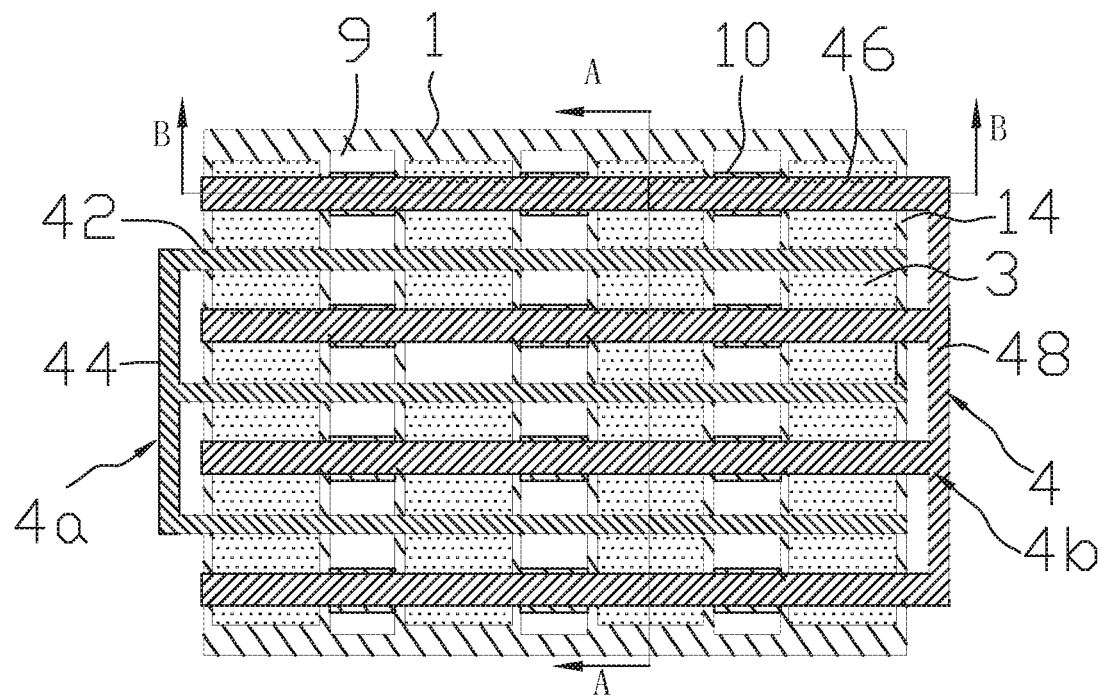
FIG. 2e is a schematic view showing further more one BCE hollowed TFT according to an embodiment of the present invention.
Figure 2F:
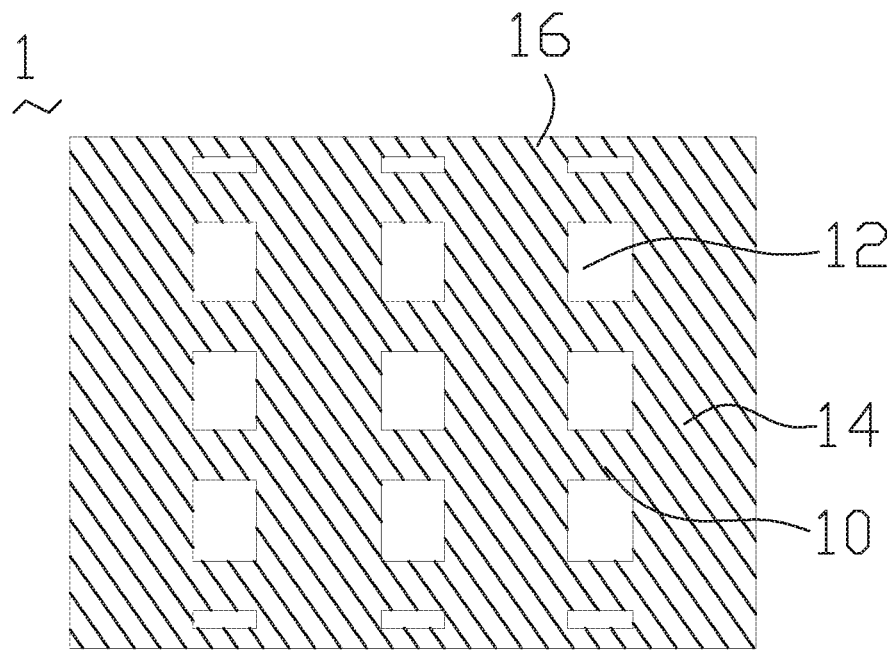
FIG. 2f is a schematic view showing a gate electrode of the hollowed TFT of FIG. 2e.
Figure 2G:
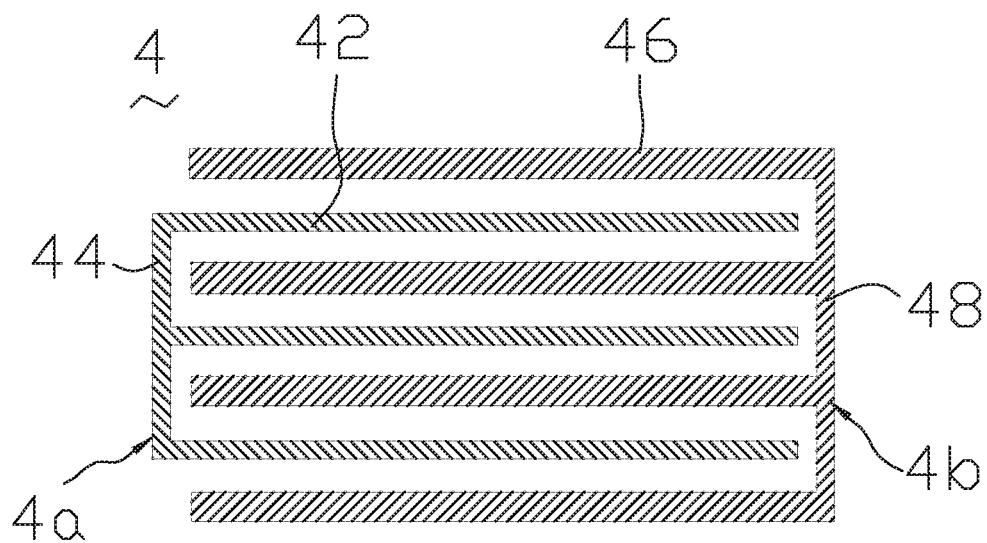
FIG. 2g is a schematic view showing a source-drain electrode layer of the hollowed TFT of FIG. 2e.
Figure 2H:
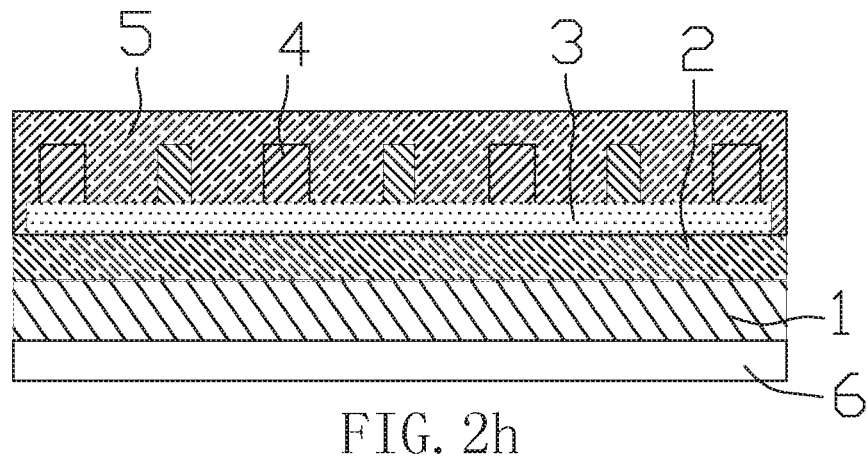
FIG. 2h is a cross-sectional view along A-A of FIG. 2e.
Figure 2I:
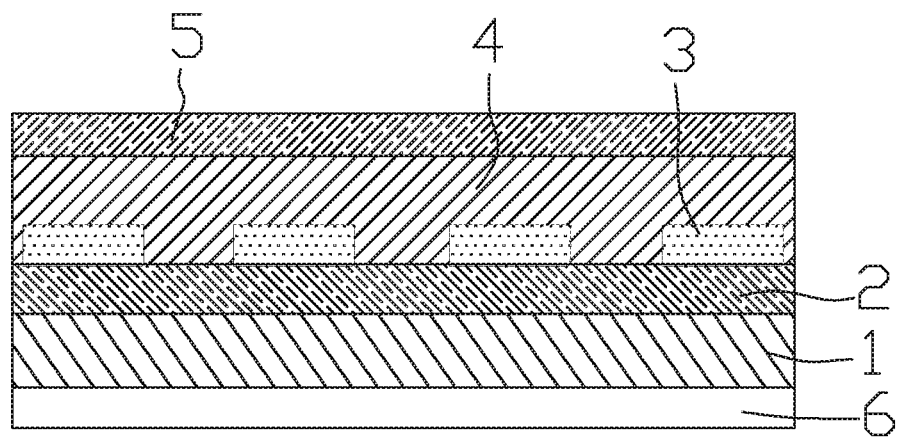
FIG. 2i is a cross-sectional view along B-B of FIG. 2e.

Referring to FIG. 1h, the difference of a BCE hollowed TFT according to the other embodiment from the BCE hollowed TFT of FIG. 1a is that, regions of the strip-shaped source portions 42 of the source electrode 4a facing the strip-shaped gate portions 14 have width larger than regions of the strip-shaped source portions 42 facing the gate hollowed domains, and regions of the strip-shaped drain portions 46 of the drain electrode 4b facing the strip-shaped gate portions 14 have width larger than regions of the strip-shaped drain portions 46 facing the gate hollowed domains.

The Second Embodiment

Referring to FIG. 2a to FIG. 2d, a TFT modified based on the first embodiment is a BCE hollowed TFT with a capacitor. The difference of the second embodiment from the first embodiment is that, a plurality of gate connecting sections 10 are disposed between every two adjacent strip-shaped gate portions 14, and every two adjacent strip-shaped gate portions 14 are connected by the gate connecting sections 10. The gate connecting sections 10 are disposed corresponding to the strip-shaped source portions 42 and/or the strip-shaped drain portions 46. In this embodiment, the gate connecting sections 10 are disposed at positions between every two adjacent strip-shaped gate portions 14 and corresponding to both the strip-shaped source portions 42 and the strip-shaped drain portions 46, and width of the gate connecting sections 10 is larger than width of the strip-shaped source portions 42 and the strip-shaped drain portions 46.

In this embodiment, the gate connecting sections 10 and the source-drain electrode layer 4 are overlapped; therefore, the overlapped portions form a capacitor. The capacitor is cooperatively formed by the gate electrode 1, the gate insulating layer 2 and the source-drain electrode layer 4. The capacitor in the GDM can be decreased because of the capacitor formed in the TFT, thus further narrow width of border.

In another embodiment, referring to FIG. 2e to FIG. 2i, the gate connecting sections 10 are disposed at positions between every two adjacent strip-shaped gate portions 14 and only corresponding to the strip-shaped drain portions 46, and width of the strip-shaped drain portions 46 is larger than width of the strip-shaped source portions 42.

The gate connecting sections 10 and the strip-shaped drain portions 46 are overlapped and the gate insulating layer 2 is disposed between the gate electrode 1 and the source-drain electrode layer 4, therefore, the overlapped regions form an extra capacitor. Moreover, width of the strip-shaped drain portions 46 is larger than width of the strip-shaped source portions 42, thus enlarging width of the strip-shaped drain portions 46. Therefore, capacitance of the extra capacitor is further increased.

The Third Embodiment

Referring to FIG. 3a to FIG. 3g, a TFT of an embodiment of the present invention is an ES (Etch Stopper), hollowed TFT, with no capacitor. The hollowed TFT includes a gate electrode 1, a gate insulating layer 2, a semiconductor layer 3, an etching stopping layer 7, a source-drain electrode layer 4 and a passivation layer 5. The gate electrode 1 is directly formed on a base 6, and the gate electrode 1 is formed of metal. The gate insulating layer 2 is disposed on the gate electrode 1, and separates the gate electrode 1 from the semiconductor layer 3. The semiconductor layer 3 is disposed on the gate insulating layer 2. The source-drain electrode layer 4, to form a source electrode 4a and a drain electrode 4b, is disposed on the etching stopping layer 7 and contacts with the semiconductor layer 3 by passing through a first etching stopping hole 8 of the etching stopping layer 7. The etching stopping layer 7 is disposed between the semiconductor layer 3 and the source-drain electrode layer 4. The passivation layer 5 is disposed at the outermost layer, and is disposed on the source-drain electrode layer 4, so as to separate the TFT from external environment. Specifically, the etching stopping layer 7 and the first etching stopping hole 8 have complementary shapes.

The material of the semiconductor layer 3 includes metal oxide, a-Si: H or poly silicon. The material of the gate electrode 1 and the source-drain electrode layer 4 is selected from a group including Ti, Cu, Al, Mo, Cr, and any combination thereof, or an alloy formed of one or more of Ti, Cu, Al, Mo, Cr. Preferably, the material of the semiconductor layer 3 is metal oxide, the material of the gate electrode 1 is Ti or Cu, and the material of the source-drain electrode layer 4 is Ti or Cu. The base 6 may be glass base.

Figure 3A:
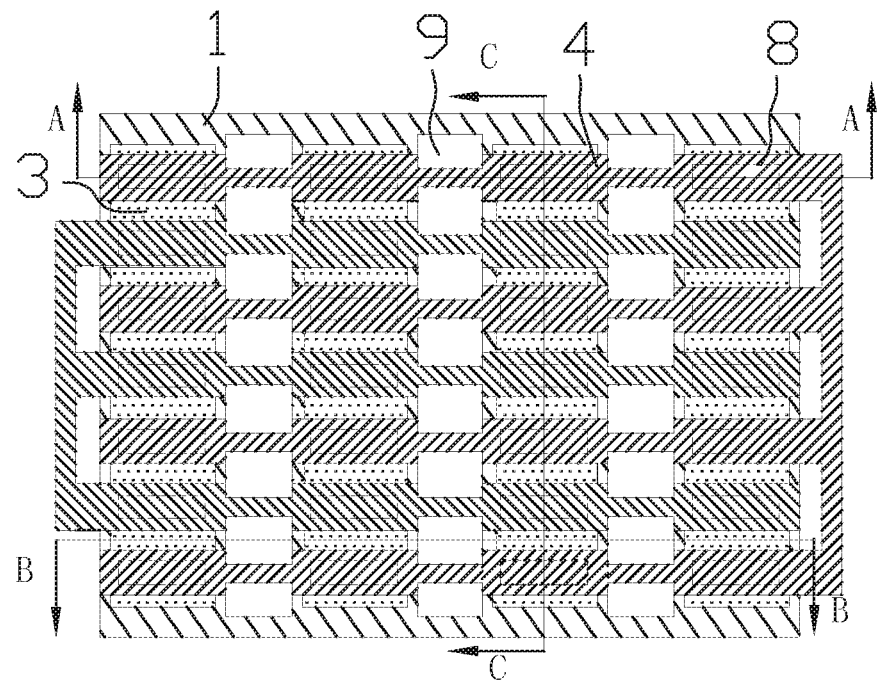
FIG. 3a is a schematic view showing an ES hollowed TFT according to an embodiment of the present invention.
Figure 3B:
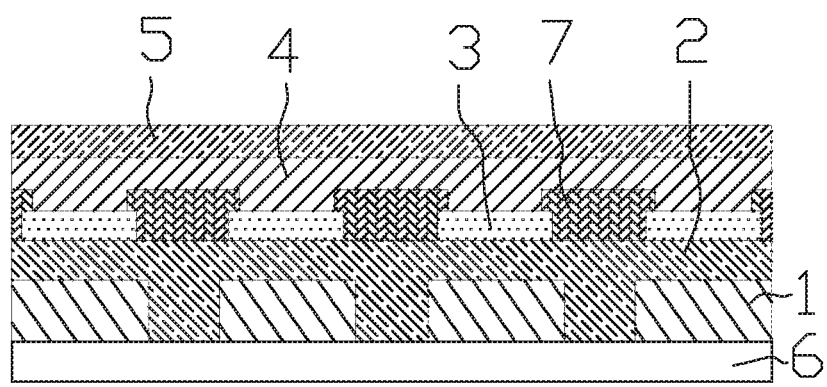
Figure 3C:
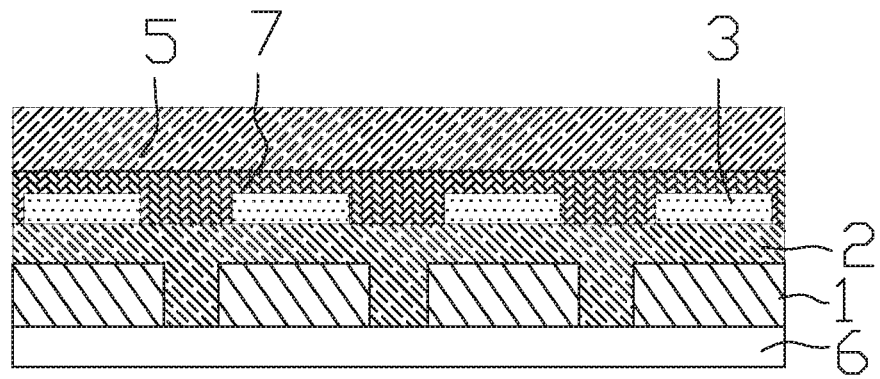
Figure 3D:
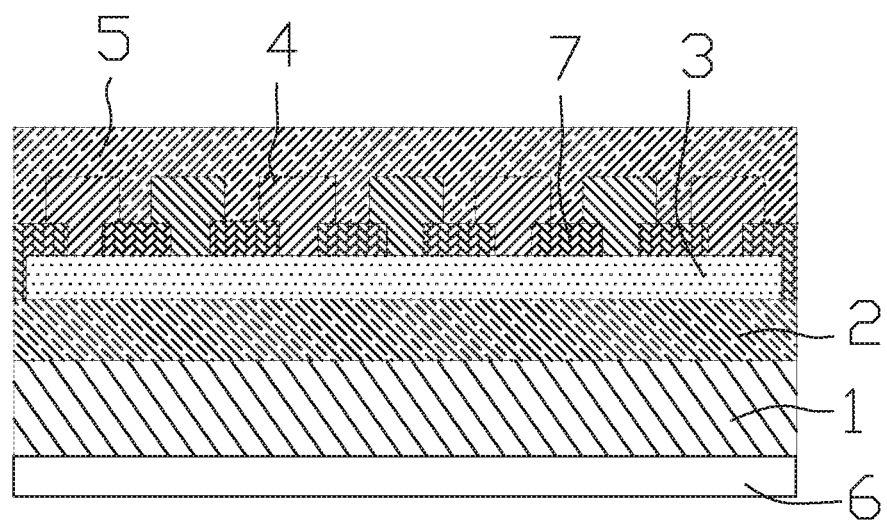
Figure 3E:
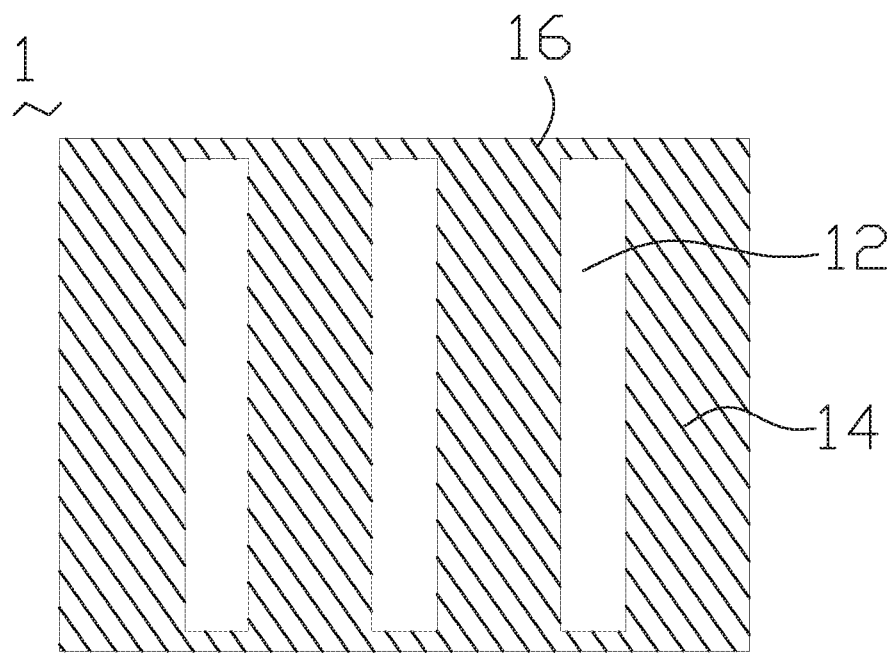

Specifically, referring to FIG. 3e, the gate electrode 1 includes a plurality of strip-shaped gate portions 14 separating from each other and gate connecting portions 16 for connecting ends of the strip-shaped gate portions 14. Two gate connecting portions 16 are disposed respectively at two ends of the strip-shaped gate portions 14. The strip-shaped gate portions 14 are parallel. A gate hollowed domain 12 is formed between every two adjacent strip-shaped gate portions 14, thus forming the hollowed structure gate electrode 1. The gate connecting portions 16 connect the separated strip-shaped gate portions 14 together, thus forming a whole one gate electrode 1.

Figure 3F:
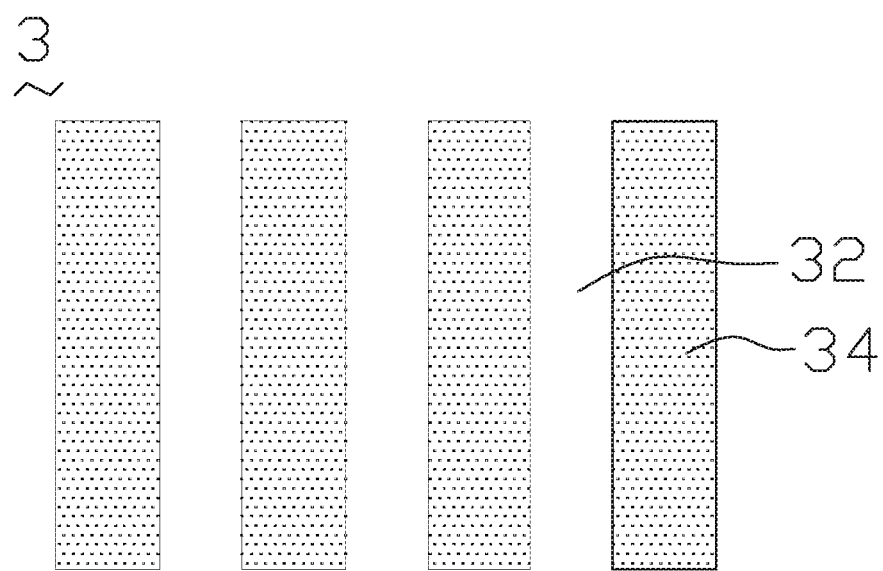

Referring to FIG. 3f, the semiconductor layer 3 includes a plurality of strip-shaped semiconductor portions 34 separating from each other, and the strip-shaped semiconductor portions 34 are parallel. A semiconductor hollowed domain 32 is formed between every two adjacent strip-shaped semiconductor portions 34, thus forming the hollowed structure semiconductor layer 3. Specifically, the semiconductor hollowed domains 32 are located corresponding to the gate hollowed domains 12, and the strip-shaped semiconductor portions 34 are located corresponding to the strip-shaped gate portions 14. The strip-shaped semiconductor portions 34 and the strip-shaped gate portions 14 extend along a first direction and overlap with each other. The first direction can be a vertical direction.

Figure 3G:
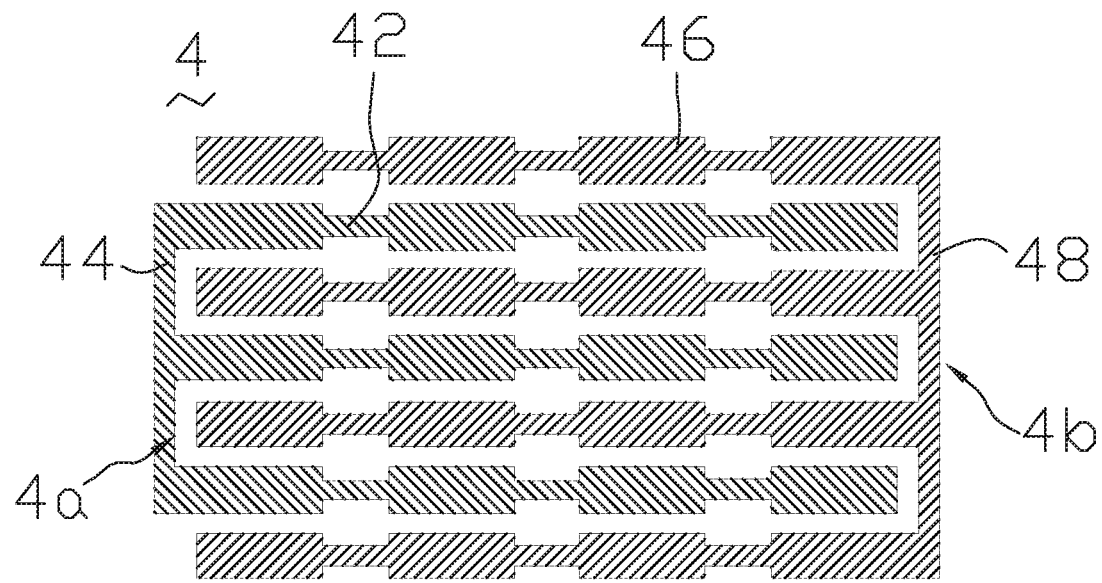
Figure 4A:
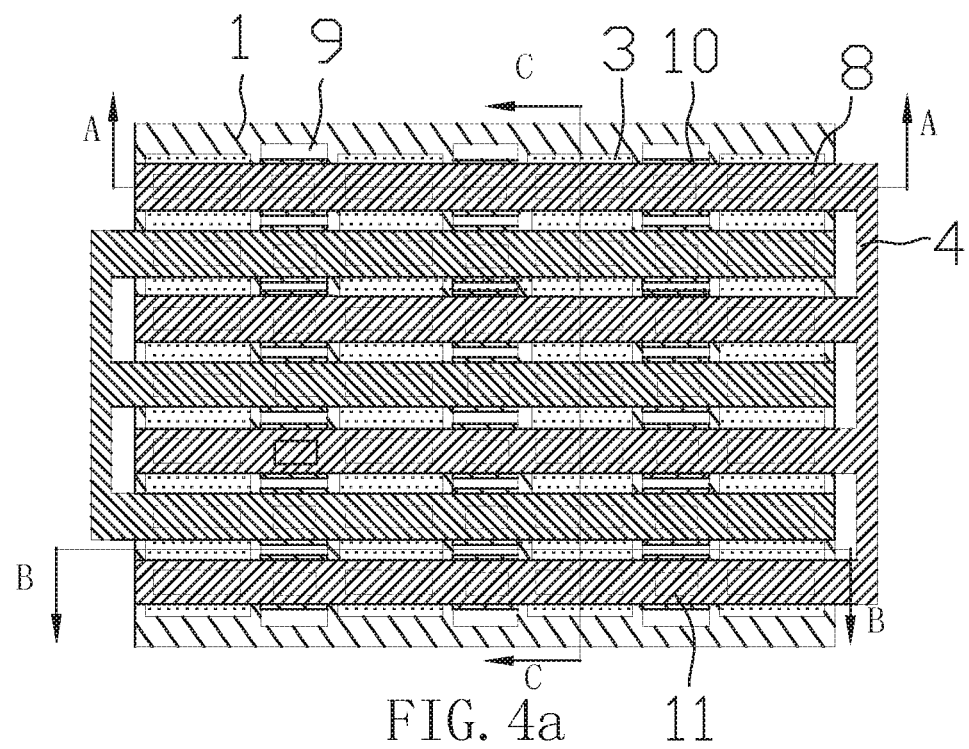
FIG. 4a is a schematic view showing the other ES hollowed TFT according to an embodiment of the present invention.
Figure 4B:
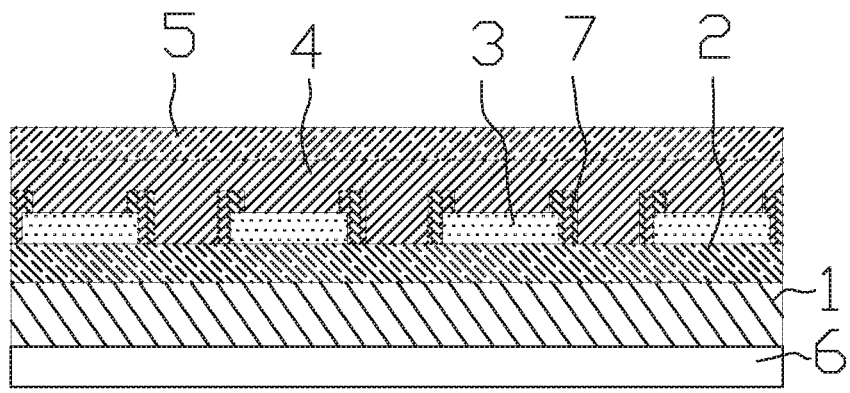
Figure 4C:
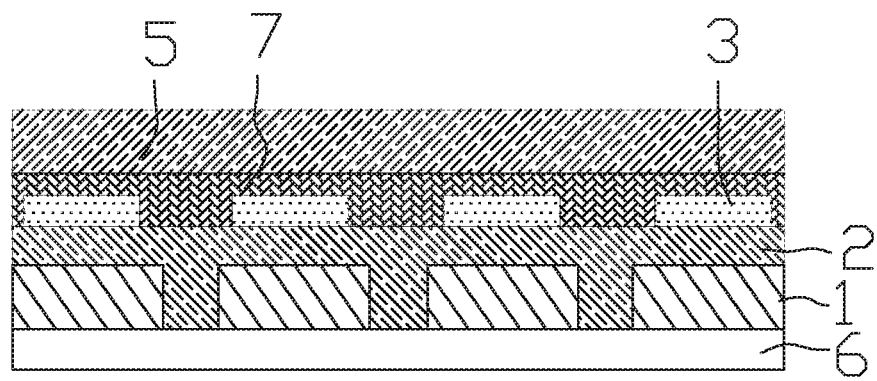
Figure 4D:
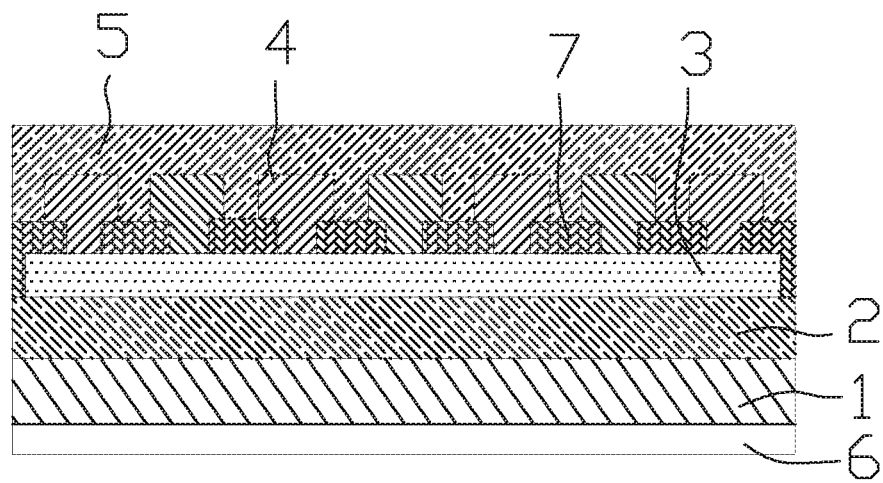
Figure 4E:
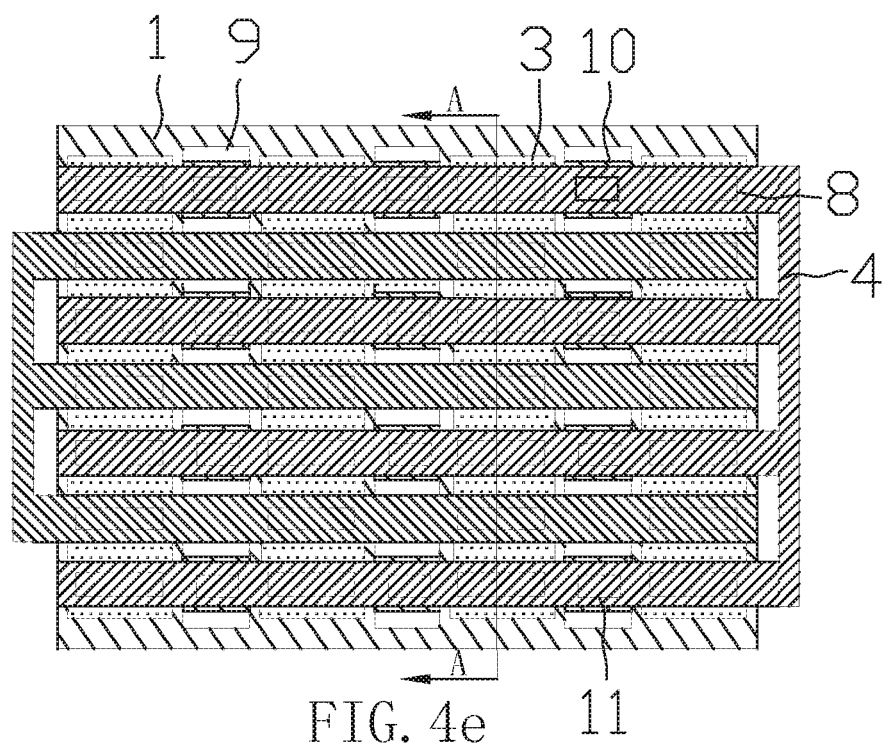
FIG. 4e is a schematic view showing more one ES hollowed TFT according to an embodiment of the present invention.
Figure 4F:
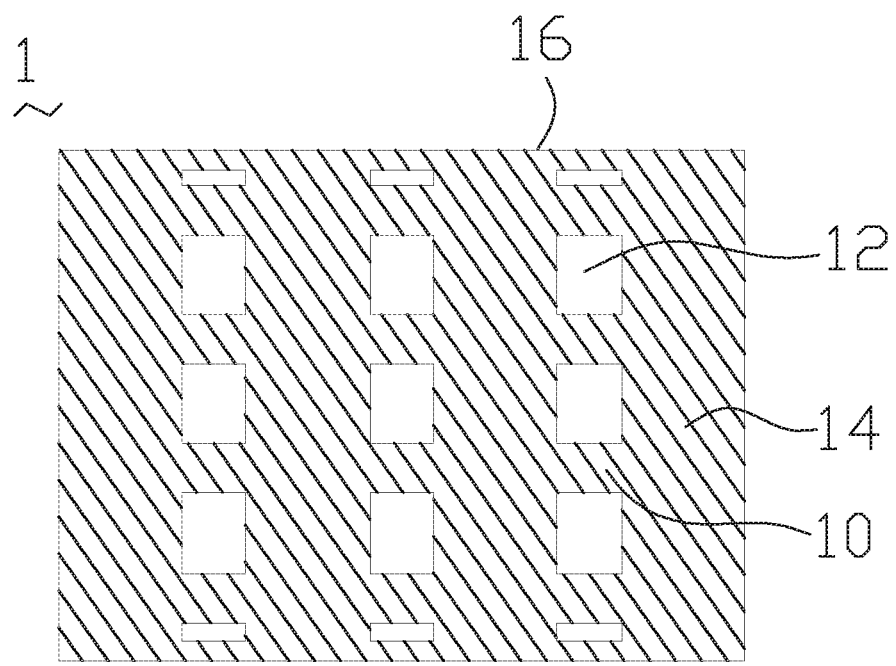
FIG. 4f is a schematic view showing a gate electrode of the hollowed TFT of FIG. 4e.
Figure 4G:
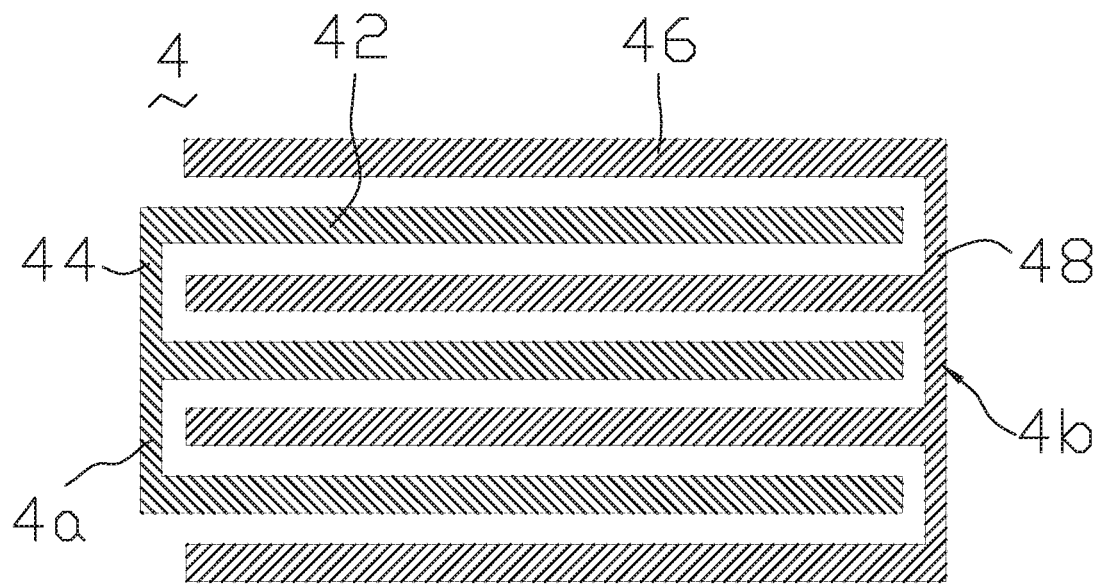
FIG. 4g is a schematic view showing a source-drain electrode layer of the hollowed TFT of FIG. 4e.
Figure 4H:
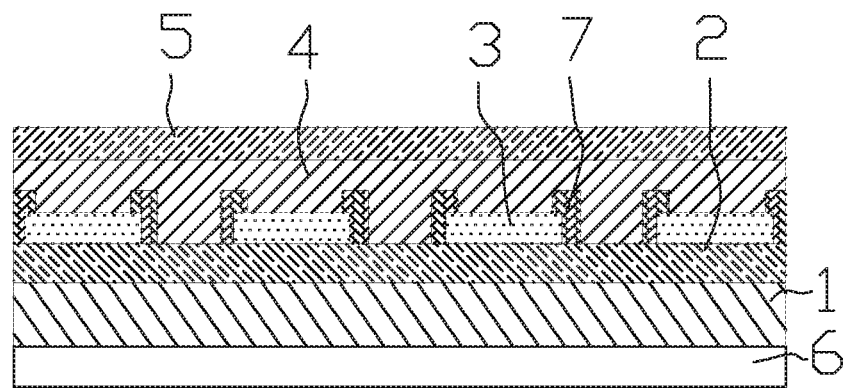
Figure 5A:
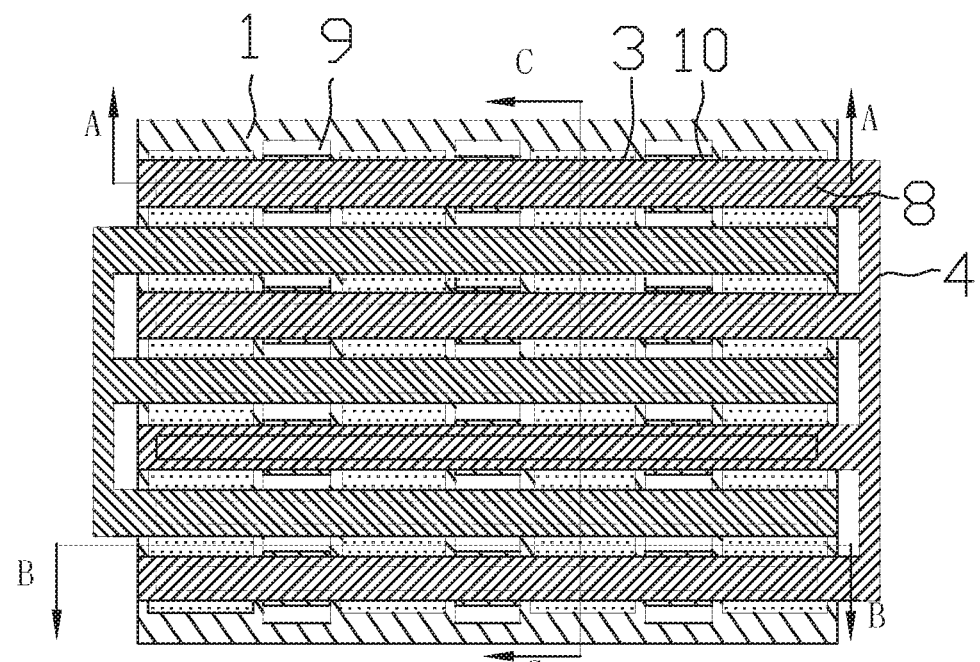
FIG. 5a is a schematic view showing further more one ES hollowed TFT according to an embodiment of the present invention.
Figure 5B:
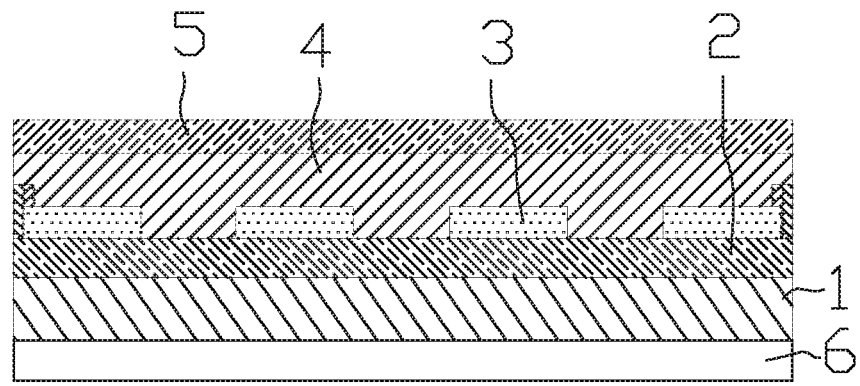
Figure 5C:
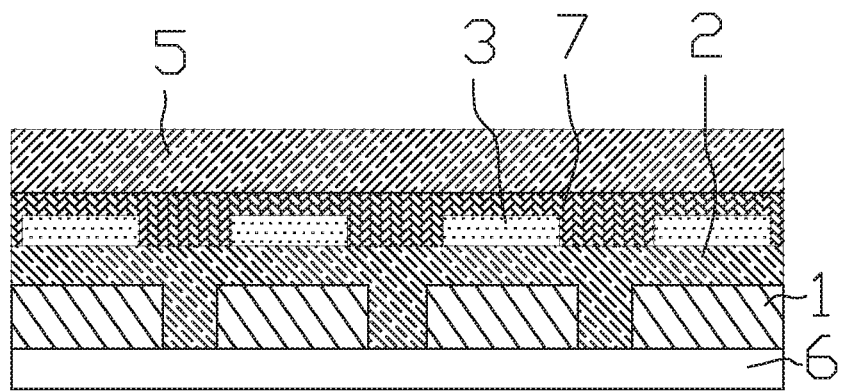
Figure 5D:
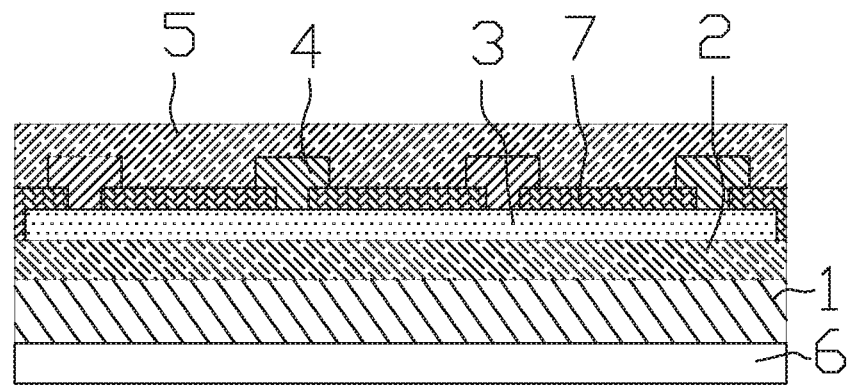

Referring to FIG. 3g, the source electrode 4a and the drain electrode 4b of the source-drain electrode layer 4 are separated. The source electrode 4a includes a plurality of strip-shaped source portions 42 separating from each other and source connecting portions 44 for connecting ends of the strip-shaped source portions 42. The strip-shaped source portions 42 are parallel. The drain electrode 4b includes a plurality of strip-shaped drain portions 46 separating from each other and drain connecting portions 48 for connecting ends of the strip-shaped drain portions 46. The strip-shaped drain portions 46 are parallel. The strip-shaped source portions 42 and strip-shaped drain portions 46 extend along a second direction. The second direction can be the horizontal direction, that is, the above first direction is perpendicular to the second direction, thus, strip-shaped semiconductor portions 34 and the strip-shaped gate portions 14 are perpendicular to the strip-shaped source portions 42 and strip-shaped drain portions 46. The source connecting portions 44 connect the separated strip-shaped source portions 42 together, thus forming a whole one source electrode 4a. The drain connecting portions 48 connect the separated strip-shaped drain portions 46 together, thus forming a whole one drain electrode 4b.

Specifically, the strip-shaped source portions 42 of the source electrode 4a and the strip-shaped drain portions 46 of the drain electrode 4b are inserted into each other, in other words, the strip-shaped source portions 42 and the strip-shaped drain portions 46 are alternately disposed. That is, one strip-shaped drain portion 46 is disposed between two strip-shaped source portions 42, and one strip-shaped source portion 42 is disposed between two strip-shaped drain portions 46.

Regions of the strip-shaped source portions 42 facing the strip-shaped gate portions 14 have width larger than regions of the strip-shaped source portions 42 facing the gate hollowed domains, and regions of the strip-shaped drain portions 46 of the drain electrode 4b facing the strip-shaped gate portions 14 have width larger than regions of the strip-shaped drain portions 46 facing the gate hollowed domains.

The gate hollowed domains 12, the semiconductor hollowed domains 32 and the gap between the strip-shaped source portions 42 and the strip-shaped drain portions 46 define a plurality of distributed hoopholes 9. The hoopholes 9 are square, rectangular or circular. It can be understood that, the hoopholes 9 may be other shapes. The hoopholes 9 may be uniformly positioned on the TFT. Solidification of the glue frame will not be affected even if the TFT with large size is overlapped with the glue frame because of the hoopholes 9. Therefore, the border width of the display panel is narrowed.

The first etching stopping hole 8 is defined on the etching stopping layer 7, and corresponding to the position where the source-drain electrode layer 4 overlapped with the gate electrode 1. The source-drain electrode layer 4 fills in the first etching stopping hole 8, thus passing through the etching stopping layer 7 to contact with the semiconductor layer 3.

The Fourth Embodiment

Referring to FIG. 4a to FIG. 4d, a TFT modified based on the third embodiment is an ES hollowed TFT with a capacitor. The difference of the fourth embodiment from the third embodiment is that, a plurality of gate connecting sections 10 are disposed between every two adjacent strip-shaped gate portions 14, and every two adjacent strip-shaped gate portions 14 are connected by the gate connecting sections 10. The gate connecting sections 10 are disposed corresponding to the strip-shaped source portions 42 and/or the strip-shaped drain portions 46. In this embodiment, the gate connecting sections 10 are disposed at positions between every two adjacent strip-shaped gate portions 14 and corresponding to both the strip-shaped source portions 42 and the strip-shaped drain portions 46, and width of the gate connecting sections 10 is larger than width of the strip-shaped source portions 42 and the strip-shaped drain portions 46.

In this embodiment, the gate connecting sections 10 and the source-drain electrode layer 4 are overlapped; therefore, the overlapped portions form a capacitor. The capacitor is cooperatively formed by the gate electrode 1, the gate insulating layer 2 and the source-drain electrode layer 4. The capacitor in the GDM can be decreased because of capacitor formed in the TFT, thus further narrow border width.

Further, second etching stopping holes 11 are defined on the etching stopping layer 7, and corresponding to the gate connecting sections 10.

In another embodiment, referring to FIG. 4e to FIG. 4h, the gate connecting sections 10 are disposed at positions between every two adjacent strip-shaped gate portions 14 and only corresponding to the strip-shaped drain portions 46.

The gate connecting sections 10 and the strip-shaped drain portions 46 of the drain electrode 4b are overlapped and the gate insulating layer 2 is disposed between two layers made of metal, i.e. the gate electrode 1 and the source-drain electrode layer 4, therefore, the overlapped portions form an extra capacitor. Moreover, width of the strip-shaped drain portions 46 is larger than width of the strip-shaped source portions 42, thus enlarging width of the strip-shaped drain portions 46. Therefore, capacitance of the extra capacitor is further increased.

The Fifth Embodiment

Referring to FIG. 5a to FIG. 5d, another TFT modified based on the fourth embodiment is an ES hollowed TFT with a capacitor. The difference of the fifth embodiment from the fourth embodiment is that, the first etching stopping holes 8 are connected as a whole one etching stopping hole, thus increasing the capacitor formed by the gate electrode 1, the gate insulating layer 2 and the source-drain electrode layer 4, and saving extra space occupied by the etching stopping hole. The connected etching stopping hole can increase overlapping area, thus further increasing the capacitance of the capacitor at the overlapping domain. Therefore, the width of the border of the display panel can be further decreased.

It can be understood that, the TFT of the present invention may be any one of structures in the first embodiment to the fifth embodiment, and also may be other structures not shown, such as, TG (Top gate) type hollowed TFT, so long as the gate electrode and the semiconductor layer are hollowed.

The Sixth Embodiment

Figure 6:
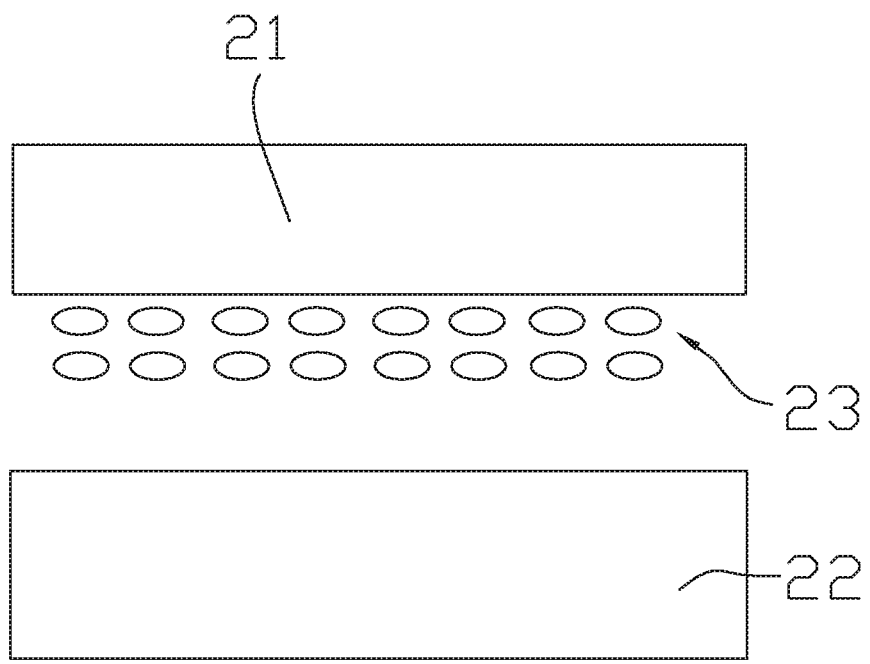
FIG. 6 is a schematic view showing a liquid crystal display according to an embodiment of the present invention.

The present invention further provides a liquid crystal display. Referring to FIG. 6, an embodiment of the liquid crystal display includes an array substrate 22, a color filter substrate 21 and a liquid crystal layer 23 placed between the array substrate 22 and the color filter substrate 21. The array substrate 22 includes any one of the TFTs described above.

Specifically, the above described TFT is positioned at border of the array substrate 22, used as gate electrode driving circuit.

Figure 7:
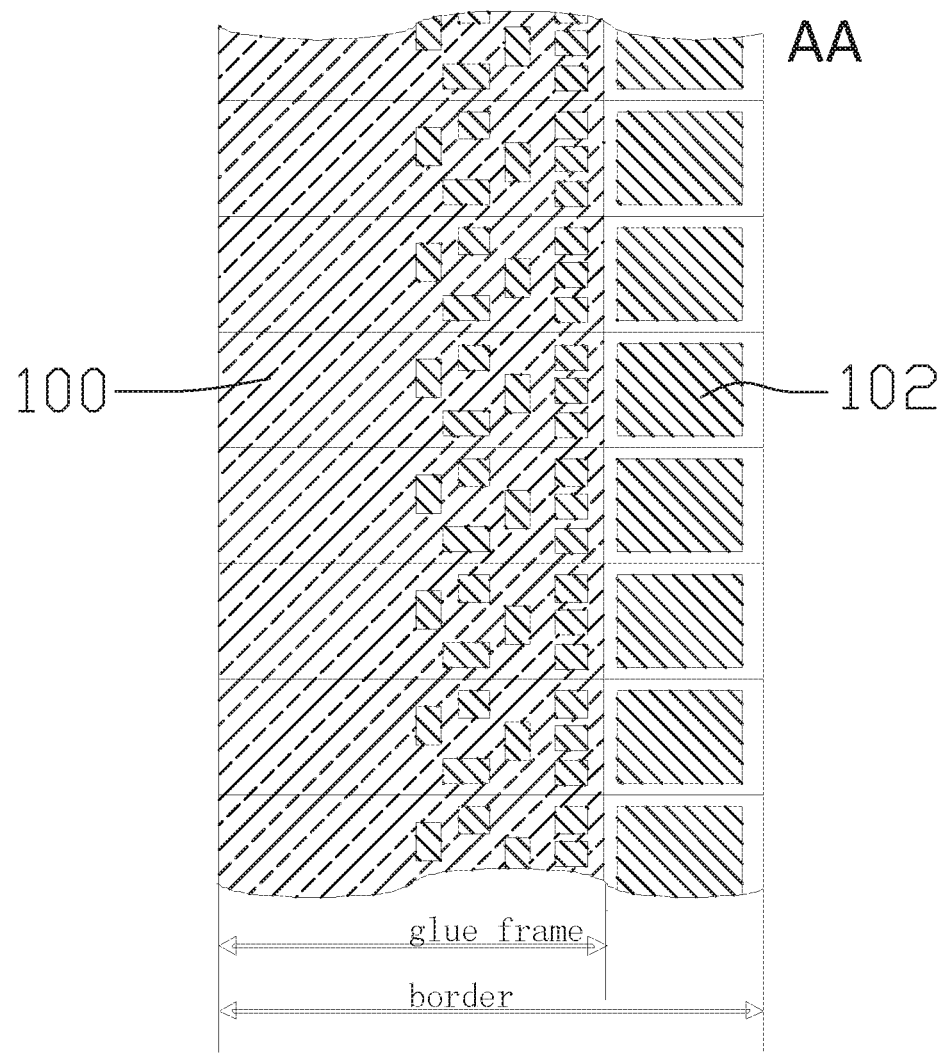
FIG. 7 is a schematic view showing a part of an array substrate of the prior art.

FIG. 7 shows an array substrate of prior art, including a glue frame 100 and non-hollowed TFTs 102. The coating area of glue frame cannot be overlapped with the TFT, or else, transmission of ultraviolet light for solidifying a glue frame will be decreased.

Figure 8:
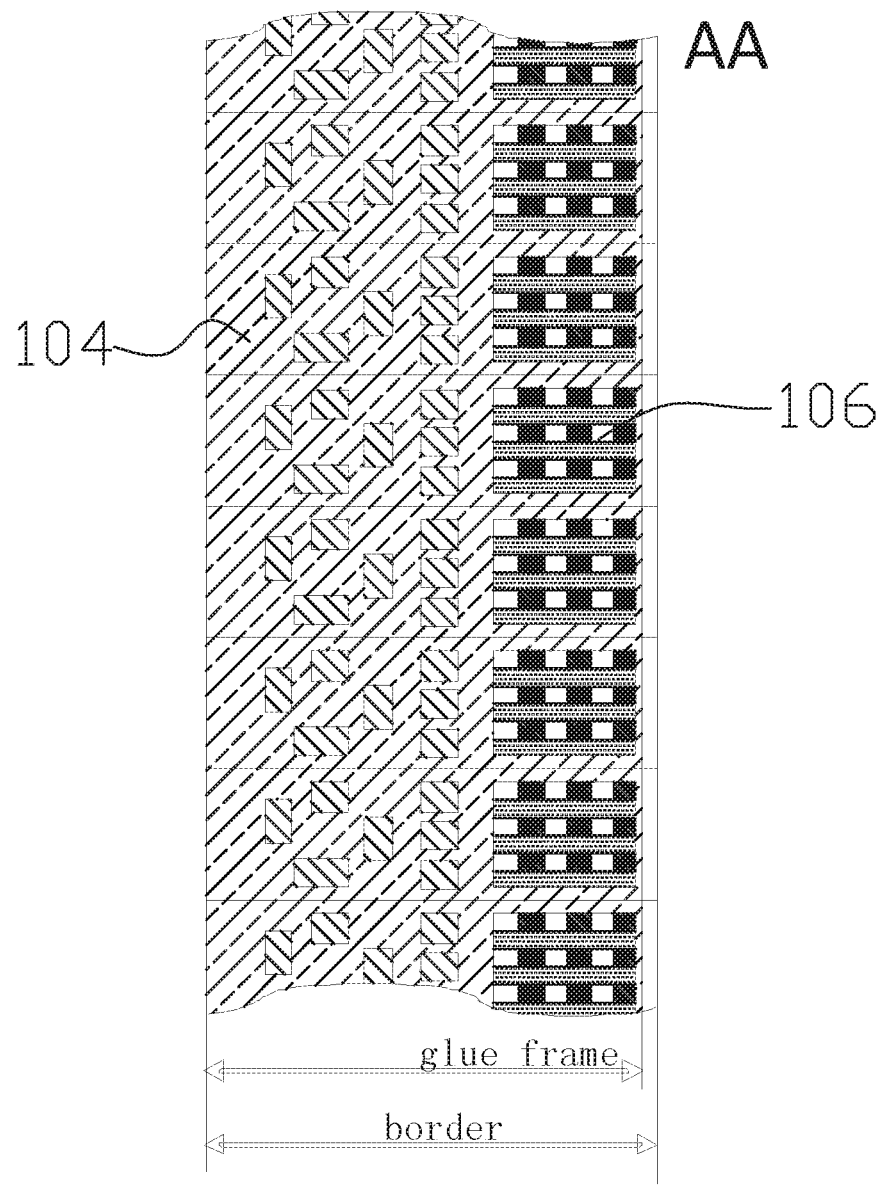
FIG. 8 is a schematic view showing a part of an array substrate having the hollowed TFT in the present invention.

FIG. 8 shows an array substrate having the hollowed TFT of any one of the first embodiment to the fifth embodiment, including a glue frame 104 and hollowed TFTs 106. The coating area of glue frame can be overlapped with the TFT because of the hollowed TFTs 106, thus further decreasing the width of the border.

The TFT of the present invention has following advantages. The gate electrode and the semiconductor of the TFT are designed as hollowed structure, thus a plurality of distributed hoopholes formed in the TFT. Therefore, transmission of ultraviolet light for solidifying glue frame is improved, so that improving the solidifying rate of the glue frame coating on the TFT. Hollowed TFT makes the coating domain of the glue frame can completely overlap with the TFT, so as to decrease the border width.

Furthermore, inner of the TFT forms a capacitor because the gate connecting sections overlapped with the source-drain electrode layer, thus the capacitance of the GDM can be reduced. The hollowed TFT and the hollowed capacitor save hollowed space, thus further decreasing width of the border occupied by the GDM and being benefit to making Ultra-narrow border.

The above are embodiments of the present disclosure only, and should not be deemed as limitations to the scope of the present disclosure. It should be noted that variations and improvements will become apparent to those skilled in the art to which the present disclosure pertains. Therefore, the scope of the present disclosure is defined by the appended claims.

INDUSTRIAL APPLICABILITY

In the embodiments of the present invention, the TFT of the present invention has following advantages. The gate electrode and the semiconductor of the TFT are designed as hollowed structure, thus a plurality of distributed hoopholes formed in the TFT. Therefore, transmission ultraviolet light for solidifying glue frame is improved, so that improving the solidifying rate of the glue frame coating on the TFT. Hollowed TFT makes the coating domain of the glue frame can completely overlap with the TFT, so as to decrease the border width.

What is claimed is:

1. A TFT (Thin Film Transistor), comprising a gate electrode, a gate insulating layer, a semiconductor layer and a source-drain electrode layer, wherein the gate insulating layer is disposed between the gate electrode and the semiconductor layer, the source-drain electrode layer contacts with the semiconductor layer, the gate electrode and the semiconductor layer are hollowed;
    the gate electrode comprises a plurality of strip-shaped gate portions separating from each other and gate connecting portions for connecting ends of the strip-shaped gate portions; a gate hollowed domain is formed between every two adjacent strip-shaped gate portions;
    the semiconductor layer comprises a plurality of strip-shaped semiconductor portions separating from each other, a semiconductor hollowed domain is formed between every two adjacent strip-shaped semiconductor portions, the semiconductor hollowed domains are located corresponding to the gate hollowed domains, and the strip-shaped semiconductor portions are located corresponding to the strip-shaped gate portions;
    the source-drain electrode layer comprises a source electrode and a drain electrode; the source electrode and the drain electrode are separated, the source electrode comprises a plurality of strip-shaped source portions separating from each other and source connecting portions for connecting ends of the strip-shaped source portions; the drain electrode comprises a plurality of strip-shaped drain portions separating from each other and drain connecting portions for connecting ends of the strip-shaped drain portions; the strip-shaped source portions and the strip-shaped drain portions are inserted into each other, the strip-shaped source portions and the strip-shaped drain portions are alternately disposed;
    a plurality of gate connecting sections are disposed between every two adjacent strip-shaped gate portions, the gate connecting sections are disposed corresponding to the strip-shaped source portions and/or the strip-shaped drain portions.

2. The TFT according to claim 1, wherein the gate insulating layer is disposed on the gate electrode, the semiconductor layer is disposed on the gate insulating layer, and the source-drain electrode layer is disposed on the semiconductor layer.

3. The TFT according to claim 1, wherein width of the gate connecting sections is larger than width of the strip-shaped source portions and/or the strip-shaped drain portions.

4. The TFT according to claim 1, wherein the plurality of gate connecting sections are disposed between every two adjacent strip-shaped gate portions, the gate connecting sections are only disposed corresponding to the strip-shaped drain portions.

5. The TFT according to claim 1, wherein the gate hollowed domains, the semiconductor hollowed domains and the gap between the strip-shaped source portions and the strip-shaped drain portions define a plurality of distributed hoopholes.

6. A TFT (Thin Film Transistor), comprising a gate electrode, a gate insulating layer, a semiconductor layer and a source-drain electrode layer, wherein the gate insulating layer is disposed between the gate electrode and the semiconductor layer, the source-drain electrode layer contacts with the semiconductor layer, the gate electrode and the semiconductor layer are hollowed; the TFT further comprises an etching stopping layer, the gate insulating layer is disposed on the gate electrode, the semiconductor layer is disposed on the gate insulating layer, the etching stopping layer is disposed between the semiconductor layer and the source-drain electrode layer, the etching stopping layer defines a first etching stopping hole, and the source-drain electrode layer contacts with the semiconductor layer by passing through the first etching stopping hole;
    the gate electrode comprises a plurality of strip-shaped gate portions separating from each other and gate connecting portions for connecting the strip-shaped gate portions, two gate connecting portions are disposed respectively at two ends of the strip-shaped gate portions, a gate hollowed domain is formed between every two adjacent strip-shaped gate portions;
    the semiconductor layer comprises a plurality of strip-shaped semiconductor portions separating from each other, a semiconductor hollowed domain is formed between every two adjacent strip-shaped semiconductor portions, the semiconductor hollowed domains are located corresponding to the gate hollowed domains, and the strip-shaped semiconductor portions are located corresponding to the strip-shaped gate portions;
    the source-drain electrode layer comprises a source electrode and a drain electrode; the source electrode and the drain electrode are separated, the source electrode comprises a plurality of strip-shaped source portions separating from each other and source connecting portions for connecting ends of the strip-shaped source portions; the drain electrode comprises a plurality of strip-shaped drain portions separating from each other and drain connecting portions for connecting ends of the strip-shaped drain portions; the strip-shaped source portions and the strip-shaped drain portions are inserted into each other, the strip-shaped source portions and the strip-shaped drain portions are alternately disposed;
    a plurality of gate connecting sections are disposed between every two adjacent strip-shaped gate portions, the gate connecting sections are disposed corresponding to the strip-shaped source portions and/or the strip-shaped drain portions.

7. The TFT according to claim 6, wherein the first etching stopping hole is defined in the etching stopping layer, and corresponding to the position where the source-drain electrode layer is overlapped with the gate electrode, the source-drain electrode layer fills in the first etching stopping hole, thus passing through the etching stopping layer to contact with the semiconductor layer.

8. The TFT according to claim 6, wherein second etching stopping holes are defined in the etching stopping layer, and corresponding to the gate connecting sections.

9. The TFT according to claim 6, wherein the gate hollowed domains of the gate electrode, the semiconductor hollowed domains of the semiconductor layer, and the gap between the strip-shaped source portions and the strip-shaped drain portions of the source-drain electrode layer define a plurality of distributed hoopholes.

10. A liquid crystal display, comprising an array substrate, a color filter substrate and a liquid crystal layer placed between the array substrate and the color filter substrate, wherein the array substrate comprises a TFT (Thin Film Transistor), the TFT comprises a gate electrode, a gate insulating layer, a semiconductor layer and a source-drain electrode layer, wherein the gate insulating layer is disposed between the gate electrode and the semiconductor layer, the source-drain electrode layer contacts with the semiconductor layer, the gate electrode and the semiconductor layer are hollowed;

the gate electrode comprises a plurality of strip-shaped gate portions separating from each other and gate connecting portions for connecting ends of the strip-shaped gate portions; a gate hollowed domain is formed between every two adjacent strip-shaped gate portions;

the semiconductor layer comprises a plurality of strip-shaped semiconductor portions separating from each other, a semiconductor hollowed domain is formed between every two adjacent strip-shaped semiconductor portions, the semiconductor hollowed domains are located corresponding to the gate hollowed domains, and the strip-shaped semiconductor portions are located corresponding to the strip-shaped gate portions;

the source-drain electrode layer comprises a source electrode and a drain electrode; the source electrode and the drain electrode are separated, the source electrode comprises a plurality of strip-shaped source portions separating from each other and source connecting portions for connecting ends of the strip-shaped source portions; the drain electrode comprises a plurality of strip-shaped drain portions separating from each other and drain connecting portions for connecting ends of the strip-shaped drain portions; the strip-shaped source portions and the strip-shaped drain portions are inserted into each other, the strip-shaped source portions and the strip-shaped drain portions are alternately disposed;

a plurality of gate connecting sections are disposed between every two adjacent strip-shaped gate portions, the gate connecting sections are disposed corresponding to the strip-shaped source portions and/or the strip-shaped drain portions.

11. The liquid crystal display according to claim 10, wherein the TFT is positioned at border of the array substrate.

12. The liquid crystal display according to claim 10, wherein the gate insulating layer is disposed on the gate electrode, the semiconductor layer is disposed on the gate insulating layer, and the source-drain electrode layer is disposed on the semiconductor layer.

13. The liquid crystal display according to claim 10, wherein width of the gate connecting sections is larger than width of the strip-shaped source portions and/or the strip-shaped drain portions.

14. The liquid crystal display according to claim 10, wherein the plurality of gate connecting sections are disposed between every two adjacent strip-shaped gate portions, the gate connecting sections are only disposed corresponding to the strip-shaped drain portions.

15. The liquid crystal display according to claim 10, wherein the gate hollowed domains, the semiconductor hollowed domains and the gap between the strip-shaped source portions and the strip-shaped drain portions define a plurality of distributed hoopholes.

* * * * *